(12) United States Patent
Jiang

(10) Patent No.: US 11,217,593 B2
(45) Date of Patent: Jan. 4, 2022

(54) MEMORY STRUCTURE AND ITS FORMATION METHOD

(71) Applicant: CHANGXIN MEMORY TECHNOLOGIES, INC., Hefei (CN)

(72) Inventor: Wen-yong Jiang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/233,552

(22) Filed: Apr. 19, 2021

(65) Prior Publication Data

US 2021/0242213 A1 Aug. 5, 2021

Related U.S. Application Data

(63) Continuation of application No. PCT/CN0219/127856, filed on Dec. 24, 2019.

(30) Foreign Application Priority Data

Jun. 4, 2019 (CN) .......................... 201910480732.8

(51) Int. Cl.
*H01L 27/108* (2006.01)

(52) U.S. Cl.
CPC .. *H01L 27/10876* (2013.01); *H01L 27/10823* (2013.01)

(58) Field of Classification Search
None
See application file for complete search history.

(56) References Cited

U.S. PATENT DOCUMENTS 7,939,403 B2 * 5/2011 Grisham ........... H01L 21/76232
438/221

FOREIGN PATENT DOCUMENTS

| CN | 101064282 A | 10/2007 |
|---|---|---|
| CN | 101086993 A | 12/2007 |
| CN | 101140936 A | 3/2008 |

* cited by examiner

*Primary Examiner* — Hsien Ming Lee
(74) *Attorney, Agent, or Firm* — Kilpatrick Townsend & Stockton LLP

(57) ABSTRACT

Embodiments provide a memory structure and its formation method. In those embodiments, a semiconductor substrate is provided. Discrete active areas arranged in rows and columns can be formed on the substrate. A first groove between two adjacent discrete active areas can be formed. The first groove can be filled with an insulating layer. Two second grooves along a row direction in each of the discrete active areas can be formed to divide the areas into a drain and two sources located on both sides of the drain. A third groove can be formed in part of the insulating layer on both sides of a bottom of the second groove. The third groove can expose a part of a surface of the sidewalls on both sides of the active area at the bottom of the second groove. The memory structure in those embodiment can help reduce current leakage.

20 Claims, 13 Drawing Sheets

MEMORY STRUCTURE AND ITS FORMATION METHOD

CROSS REFERENCE

The present disclosure is a continuation of PCT/CN2019/127856, filed on Dec. 24, 2019, which claims priority to Chinese Patent Application No. 201910480732.8, titled "A MEMORY STRUCTURE AND ITS FORMATION METHOD" and filed on Jun. 4, 2019, the entire contents of which are incorporated herein by reference as a part of the present disclosure.

TECHNICAL FIELD

The present invention relates to the field of memory, in particular to a memory structure and its formation method.

BACKGROUND

Dynamic Random Access Memory (DRAM) is a semiconductor memory device commonly used in computers and is composed of many repeated memory cells. Each memory cell is usually composed of a capacitor and a transistor. The transistor has its gate connected to word line, its drain connected to bit line and its source connected to capacitor. Voltage signal on the word line can control on or off of the transistor and then read the date information stored in the capacitor through the bit line or write the data information into the capacitor through the bit line for storage.

However, since the memory structure composed of capacitor and transistor in existing memories is prone to leakage current, the performance of existing memories are expected to be further improved.

SUMMARY

The present invention is intended to eliminate the technical problem by reducing the leakage current of the memory structure composed of capacitor and transistor in existing memories.

To this end, the present invention provides a formation method of memory structure, which includes:

Providing a semiconductor substrate, on which a number of discrete active areas arranged in rows and columns are formed. There is a first groove between adjacent active areas, which is filled with an insulating layer;

Etching the active areas and forming two second grooves along the row direction in each active area. The two second grooves divide each of the discrete active area into a drain located in the middle of each of the discrete active areas and two sources located on both sides of the drain;

Etching and remove part of the insulating layer on both sides of the bottom of the second groove, and forming a third groove in the insulating layer to exposes at least part of the surface of the sidewalls on both sides of the active area at the bottom of the second groove. The third groove is in connection with the corresponding second groove; the two adjacent third grooves are not connected in the row direction;

Forming a gate structure in the second groove and the third groove.

In some embodiments, an anti-etching dielectric layer is formed on the sidewalls of the active area between the two second grooves and in the insulating layer. The anti-etching dielectric layer is made of the material different from that of the insulating layer.

In some embodiments, the depth of the anti-etching dielectric layer is greater than a total depth of the third groove and the second groove; and a width of the anti-etching dielectric layer in the column direction is greater than a width of the third groove in the column direction.

In some embodiments, the formation process of the anti-etching dielectric layer involves: forming a mask layer on the insulating layer and the active area, wherein the mask layer comprises a number of openings along the row direction, wherein each opening exposing at least part of the surface of the insulating layer on both sides of the active area; etching the insulating layer along the openings by using the mask layer as a mask and forming a fourth groove in the insulating layer, wherein the fourth groove exposing part of the sidewall of the active area; and forming an anti-etching dielectric layer filling the fourth groove.

In some embodiments, a protective sidewall is formed on the sidewall of the second groove before the part of the insulating layer on both sides of the bottom of the second groove is etch removed and before the third groove is formed in the insulating layer exposing part of the sidewall of the active area at the bottom of the second groove.

In some embodiments, the specific process of forming a number of discrete active areas arranged in rows and columns on the semiconductor substrate involves: forming a number of discrete elongated active areas arranged in a column direction on the semiconductor substrate, with a first trench between adjacent elongated active areas and with the first trench filled with a first isolation layer; etching the elongated active areas and the first isolation layer, and forming a number of second trenches arranged in a row direction in the elongated active areas and the first isolation layer, with the second trench disconnecting the elongated active areas to form a number of discrete active areas arranged in rows and columns and with a first groove formed by the first trench and the second trench.

In some embodiments, a second isolation layer filling the second trench is formed, wherein an insulating layer is formed by the first isolation layer and the second isolation layer.

In some embodiments, the elongated active area at the bottom of the second trench and the first isolation layer are etched and a third trench is formed in the elongated active area at the bottom of the second trench and in the first isolation layer before forming the second isolation layer, wherein the size of the third trench in the row direction larger than the size of the second trench in the row direction; a second isolation layer is formed in the third trench and the second trench.

In some embodiments, a depth of the second trench or a total depth of the second trench and a third trench is greater than the total depth of the second groove and the third groove.

In some embodiments, the third groove only exposes part of the surface of the sidewalls on both sides of the active area at the bottom of the second groove.

In some embodiments, in addition to exposing part of the surface of the sidewalls on both sides of the active area at the bottom of the second groove, the third groove also exposes part of the sidewall surface of the second trench or the third trench, or part of the surface of one sidewall of the active area away from the second groove.

In some embodiments, the gate structure is composed of: a gate dielectric layer located on the sidewall surfaces of the second groove and the third groove; and a gate located on the gate dielectric layer and filled with the second groove and the third groove.

In some embodiments, the formation method proposed in the present invention also involves: forming a word line connected to the gate; forming a capacitor connected to the source on the insulating layer; and forming a bit line connected to the drain on the insulating layer.

The present invention also provides a memory structure, which is composed of:

A semiconductor substrate, wherein discrete active areas are arranged in rows and columns on the semiconductor substrate, and a first groove exists between two of the discrete active areas that are adjacent, the first groove being filled with an insulating layer;

Two second grooves along a row direction in each of the active areas, wherein the two second grooves divide each of the discrete active areas into a drain located in middle of each of the discrete active areas and two sources located on both sides of the drain;

A third groove formed in part of the insulating layer on both sides of the bottom of the second groove, wherein the third groove exposes at least part of the surface of the sidewalls on both sides of the active area at the bottom of the second groove, and is in connection with the second groove, wherein the third grooves is not connected in the row direction with another third groove adjacent to the third groove; and A gate structure in the second groove and the third groove.

In some embodiments, an anti-etching dielectric layer is formed on the sidewalls of the active area between the two second grooves and in the insulating layer, wherein the anti-etching dielectric layer is made of the material different from that of the insulating layer.

In some embodiments, the depth of the anti-etching dielectric layer is greater than a total depth of the third groove and the second groove; and a width of the anti-etching dielectric layer in the column direction is greater than the width of the third groove in the column direction.

In some embodiments, a protective sidewall is formed on the sidewall of the second groove.

In some embodiments, the first groove includes a first trench in a column direction and a second trench in a row direction, wherein the first trench is filled with a first isolation layer, and the second trench is filled with a second isolation layer.

In some embodiments, a third trench is formed at the bottom of the second trench, wherein a size of the third trench in the row direction greater than the size of the second trench in the row direction, wherein the third trench and the second trench are filled with the second isolation layer.

In some embodiments, the depth of the second trench or the total depth of the second trench and the third trench is greater than the total depth of the second groove and the third groove.

In some embodiments, the third groove only exposes part of the surface of the sidewalls on both sides of the active area at the bottom of the second groove.

In some embodiments, in addition to exposing part of the surface of the sidewalls on both sides of the active area at the bottom of the second groove, the third groove also exposes part of the sidewall surface of the second trench or the third trench, or part of the surface of one sidewall of the active area away from the second groove.

In some embodiments, the gate structure includes: a gate dielectric layer located on the sidewall surfaces of the second groove and the third groove; and a gate located on the gate dielectric layer and filled with the second groove and the third groove.

In some embodiments, the gate structure also includes: a word line connected to the gate; a capacitor connected to the source on the insulating layer; and a bit line connected to the drain on the insulating layer.

Compared with the prior art, the technical solutions proposed in the present invention have the following advantages:

The formation method of the memory structure of the present invention involves: etching and removing part of the insulating layer on both sides of the bottom of the second groove, and forming a third groove in the insulating layer which exposes at least part of the surface of the sidewalls on both sides of the active area at the bottom of the second groove after etching the active area, forming two second grooves along the row direction in each active area and dividing each active area by the two second grooves into a drain located in the middle and two sources located on both sides of the drain, with the third groove in connection with the corresponding second groove and the two adjacent third grooves not connected in the row direction; and then forming a gate structure in the second groove and the third groove. By forming the aforementioned third groove structure, the gate structure formed in the third groove and the second groove at least covers three sides of the active area (channel area) between source and drain, which increases the area of the gate structure, improves the control of the gate structure over the channel area and limits the leakage path of the leakage current between plate of the capacitor (the capacitor is used to store data and has one of its plates electrically connected to the source) and the semiconductor substrate, thereby effectively reducing the leakage current, increasing the area of word line (there is word line in the gate structure) and lowering the resistance value of word line.

Furthermore, in addition to exposing part of the surface of the sidewalls on both sides of the active area at the bottom of the second groove, the third groove also exposes part of the sidewall surface of the second trench or the third trench (the position corresponding to the second isolation layer), or part of the surface of one sidewall of the active area away from the second groove. After a gate structure is formed in the third groove and the second groove, such the third groove structure makes the gate structure surround the surrounding sidewalls of the active area (channel area) between source and drain and therefore increases the area of the gate structure, improves the control of the gate structure over the channel area and further limits the leakage path of the leakage current between plate of the capacitor (the capacitor is used to store data and has one of its plates electrically connected to the source) and the semiconductor substrate, thereby effectively reducing the leakage current, increasing the area of word line (there is word line in the gate structure) and lowering the resistance value of word line.

Furthermore, an anti-etching dielectric layer is formed on the sidewalls of the active area between the two second grooves and in the insulating layer. The anti-etching dielectric layer is made of the material different from that of the insulating layer, and when subsequently etching and removing part of the insulating layer on both sides of the bottom of the second groove and forming a third groove in the insulating layer which exposes at least part of the surface of the sidewalls on both sides of the active area at the bottom of the second groove, it prevents the connection between the adjacent second grooves or the adjacent third grooves so as to form two independent word lines (gate structure) subsequently.

Furthermore, a protective sidewall is formed on the sidewall of the second groove before etching and removing part of the insulating layer on both sides of the bottom of the second groove and forming a third groove in the insulating layer which exposes part of the sidewall of the active area at the bottom of the second groove. When part of the insulating layer on both sides of the bottom is subsequently etched and removed, the protective sidewall protects the source and the drain on both sides of the sidewall of the second groove from being damaged by etching, and prevents feature size of the window of the second groove from changes.

The memory structure proposed in the present invention is composed of two second grooves along the row direction in each active area, which divide each active area into a drain located in the middle and two sources located on both sides of the drain; a third groove in part of the insulating layer on both sides of the bottom of the second groove, which exposes at least part of the surface of the sidewalls on both sides of the active area at the bottom of the second groove and is in connection with the corresponding second groove with the two adjacent third grooves not connected in the row direction; and a gate structure in the second groove and the third groove. Such composition enables the gate structure to at least cover three sides of the active area (channel area) between source and drain, which increases the area of the gate structure, improves the control of the gate structure over the channel area and limits the leakage path of the leakage current between plate of the capacitor (the capacitor is used to store data and has one of its plates electrically connected to the source) and the semiconductor substrate, thereby effectively reducing the leakage current, increasing the area of word line (there is word line in the gate structure) and lowering the resistance value of word line.

DESCRIPTION OF THE EMBODIMENTS

Figure 1:
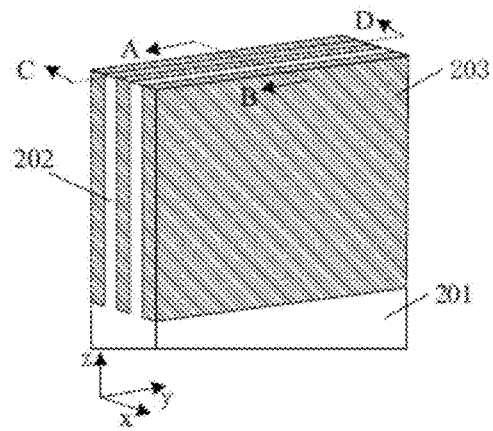
FIG. 1-FIG. 28 are schematic structural diagrams showing formation process of the memory structure described in the embodiments of the present invention.

As mentioned in the "BACKGROUND" section above, existing memory structures are prone to leakage current, and the performance of existing memories remains to be further improved.

According to a study, in existing technology, to reduce current leakage in memory capacitor in DRAM and to increase off-resistance of transistor, a trench-type transistor structure is usually used. The trench-type transistor structure can comprise a semiconductor substrate, a trench in the semiconductor substrate, a gate in the trench, and a drain area and a source area in the semiconductor substrate located on both sides of the trench. The trench-type transistor has its gate connected to word line, its drain area connected to bit line and its source area connected to capacitor. Since some electrons will leak from the source area into the semiconductor substrate when the transistor is turned off, storage capacity of DRAM can decrease. How to reduce current leakage in memory structure has become an urgent problem to be solved.

To this end, various embodiments provide a memory structure and its formation method. In those embodiments, the formation method of the memory structure can include: etching and removing part of an insulating layer on both sides of a bottom of a second groove, and forming a third groove in an insulating layer which exposes at least part of the surface of the sidewalls on both sides of the active area at the bottom of the second groove after etching the active area, forming two second grooves along the row direction in each active area and dividing each active area by the two second grooves into a drain located in the middle and two sources located on both sides of the drain, with the third groove in connection with the corresponding second groove and the two adjacent third grooves not connected in the row direction; and then forming a gate structure in the second groove and the third groove. By forming the aforementioned third groove structure, the gate structure formed in the third groove and the second groove at least covers three sides of the active area (channel area) between source and drain, which can increase the area of the gate structure, improves the control of the gate structure over the channel area and limits the leakage path of the leakage current between plate of the capacitor (the capacitor is used to store data and has one of its plates electrically connected to the source) and the semiconductor substrate, thereby effectively reducing the leakage current, increasing the area of word line (there is word line in the gate structure) and lowering the resistance value of word line.

In order to provide a clear explanation and illustration, various embodiments herein are described in detail below with reference to the accompanying drawings. When describing the embodiments in detail, the schematic diagrams attached hereto, for illustrative purposes, are not partially enlarged based on the regular scale, and are not intended to limit the protection scope of the present invention but only serve as examples. Besides, the three-dimensional size of length, width and depth should be made clear in practical application.

FIG. 1-FIG. 28 are schematic structural diagrams showing formation process of the memory structure described in the embodiments of the present invention.

Figure 7:
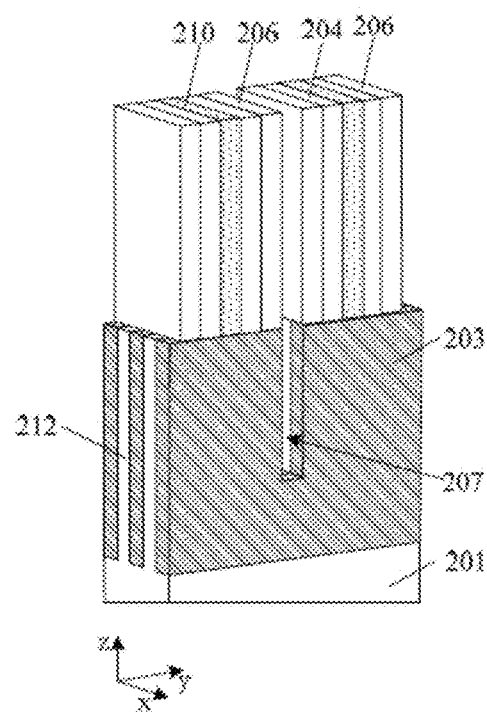
Figure 8:
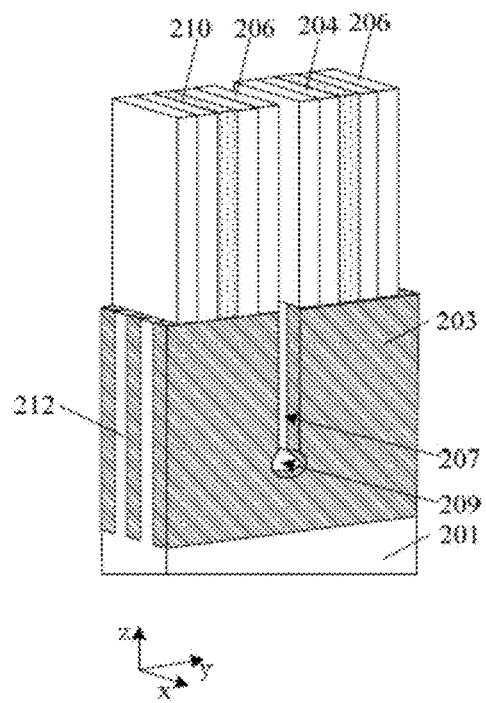
Figure 9:
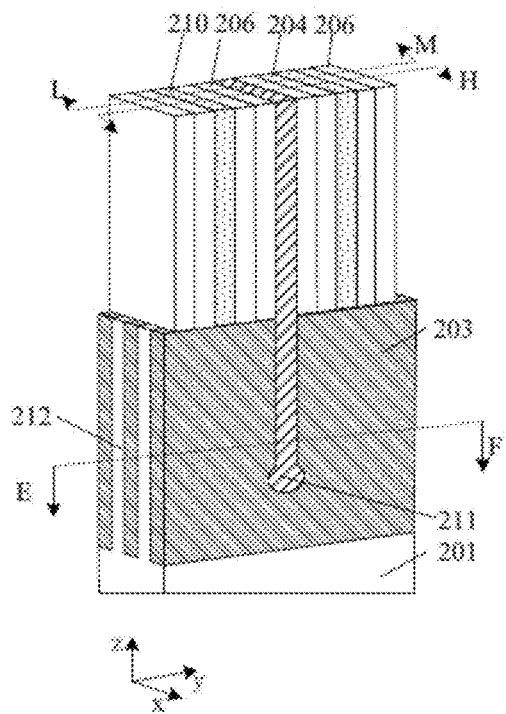
Figure 10:
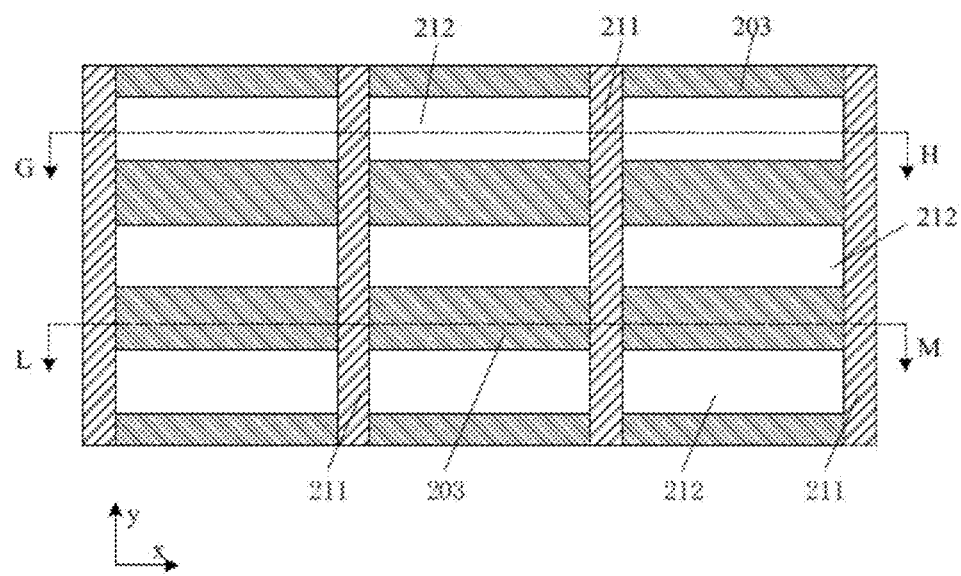
Figure 11:
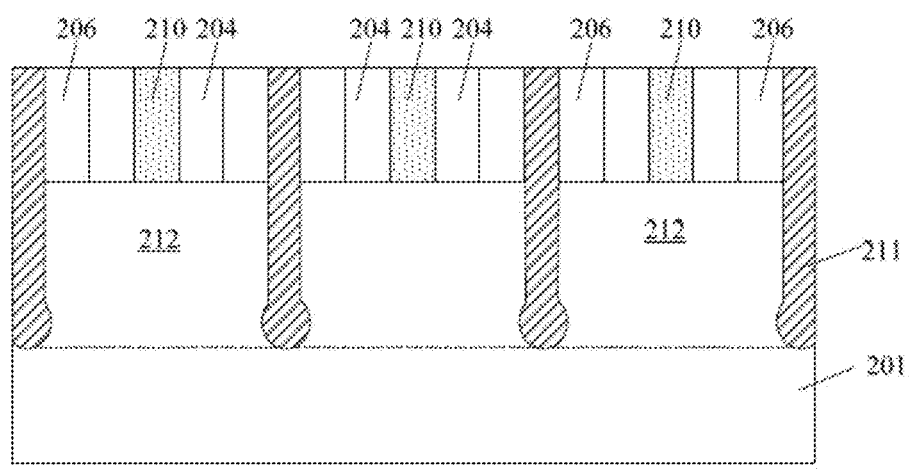
Figure 12:
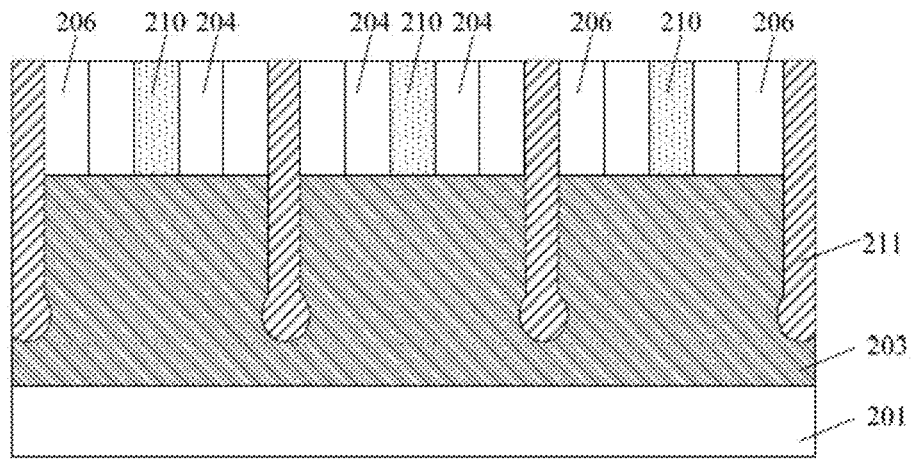

As shown in FIG. 1 to FIG. 12, FIG. 10 is a cross-sectional schematic view taken along the cutting line EF in FIG. 9; FIG. 11 is a cross-sectional schematic view taken along the cutting line GH in FIG. 9; and FIG. 12 is a cross-sectional schematic view taken along the cutting line LM in FIG. 9. A semiconductor substrate 201 is provided, on which a number of discrete active areas 212 arranged in rows and columns are formed. There is a first groove between adjacent active areas 212, which is filled with an insulating layer.

The discrete active areas 212 may be formed by etching the semiconductor substrate 201 or by using epitaxial process.

Figure 2:
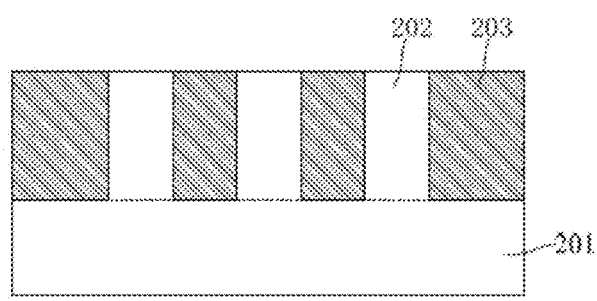
Figure 3:
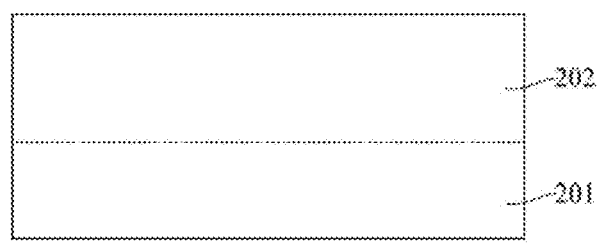

In this embodiment, the discrete active areas 212 are formed by etching the semiconductor substrate 201, with a formation process described in detail below with reference to the accompanying drawings (FIG. 1-FIG. 12). The formation process of the active areas 212 may include:

As shown in FIG. 1 to FIG. 3, FIG. 2 is a cross-sectional schematic view taken along the cutting line AB in FIG. 1; and FIG. 3 is a cross-sectional schematic view taken along the cutting line CD in FIG. 1. A semiconductor substrate 201 is provided, on which a number of discrete elongated active areas 202 arranged in a column direction are formed, with a first trench between adjacent elongated active areas 202 and with the first trench filled with a first isolation layer 203.

The semiconductor substrate 201 may be made of silicon (Si), germanium (Ge), silicon germanium (GeSi) or silicon carbide (SiC), or silicon-on-insulator (SOT) or germanium-on-insulator (GOT), or other materials such as gallium arsenide and other group III-V compounds. In this embodiment, the semiconductor substrate 201 is a silicon substrate, and is doped with certain impurity ions as required, which impurity ions may be N-type impurity ions or P-type impurity ions. In an embodiment, the doping includes doping in well areas and doping in drain areas.

The elongated active areas 202 are subsequently used to form a number of discrete active areas 212 (refer to FIG. 9 to FIG. 12), and the first isolation layer 203 is subsequently used for electrical isolation between the active areas 212. In an embodiment, the formation process of the elongated active areas 202 and the first isolation layer 203 involves: forming a mask layer on the semiconductor substrate 201 (not shown in accompanying drawings), which mask layer has a number of openings along the column direction; etching the semiconductor substrate 201 along the openings by using the mask layer as a mask, and forming a number of discrete elongated active areas 202 in the semiconductor substrate 201 with a first trench between adjacent elongated active areas 202; forming an isolation material layer in the first trench and on the surface of the mask layer, with the isolation material layer filling the first trench; planarizing and removing the isolation material layer and mask layer on the surface of the elongated active areas 202, and forming a first isolation layer 203 in the first trench. It should be noted that the column direction described in the present application refers to the direction parallel to the x-axis, and for illustrative purposes, the elongated active areas 202 and the semiconductor substrate 201 are distinguished dotted lines in FIG. 2 and FIG. 3.

The first isolation layer 203 may be made of silicon oxide, silicon nitride, silicon oxynitride or other suitable isolation materials. In this embodiment, the first isolation layer 203 is made of silicon oxide.

Figure 4:
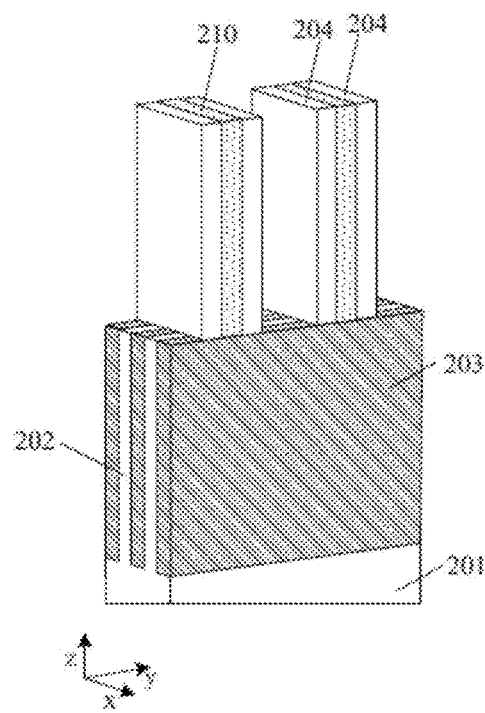

As shown in FIG. 4, a number of first mask patterns 210 arranged along the row direction are formed on the elongated active areas 202 and the first isolation layer 203; and a second mask pattern 204 is formed on the sidewalls on both sides of the first mask patterns 210.

The first mask patterns 210 are arranged in parallel along the row direction with the row direction perpendicular to the column direction. In this embodiment, the row direction is parallel to the y axis.

The position where the fourth groove is subsequently formed in the insulating layer corresponds to the position where the first mask patterns 210 are. The position where the two second grooves along the row direction are subsequently formed corresponds to the position where the second mask pattern 204 is.

In this embodiment, the first mask patterns 210 and the second mask pattern 204 are made of different materials. In one embodiment, the first mask patterns 210 are made of silicon nitride, and the second mask pattern 204 is made of silicon oxynitride. In other embodiments, the first mask patterns 210 and the second mask pattern 204 can be also made of other suitable materials.

In one embodiment, the formation process of the second mask pattern 204 involves: forming a second mask material layer (not shown in accompanying drawings) on the surface of the first mask patterns 210 and the surface of the elongated active areas 202 and the first isolation layer 203; etching the second mask material layer without a mask; and forming a second mask pattern 204 on the sidewalls on both sides of the first mask patterns 210.

In other embodiments, first mask pattern may not be formed first, but a second mask pattern may be formed first in the elongated active areas and on the first isolation layer, and after the second mask pattern is formed, a first mask pattern and a third mask pattern may be subsequently formed simultaneously.

Figure 5:
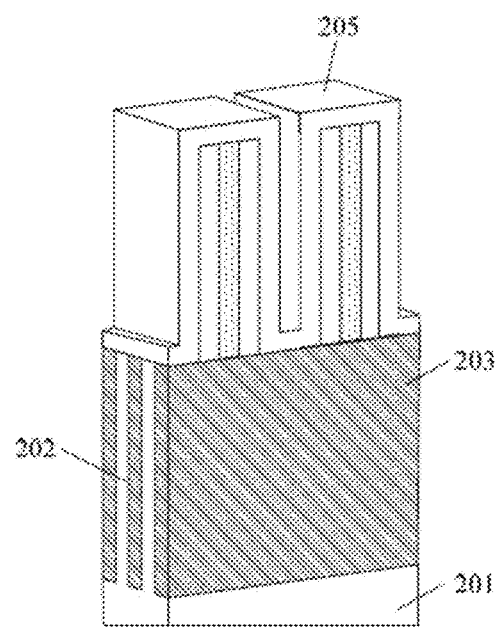
Figure 6:
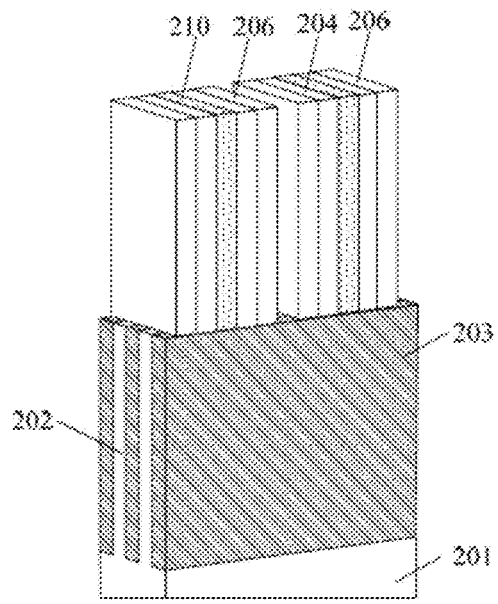

As shown in FIG. 4 and FIG. 5, a third mask pattern 206 can be formed on the surface of the sidewall of the second mask pattern 204.

In one embodiment, the formation process of the third mask pattern 206 includes: forming a third mask material layer 205 on the surface of the first mask patterns 210 and the second mask pattern 204 and on the surface of the elongated active areas 202 and the first isolation layer 203, etching the third mask material layer 205 without a mask; and forming a third mask pattern 206 on the surface of the sidewall of the second mask pattern 204.

The third mask pattern 206 is used as a mask in subsequent etching of the elongated active areas and the first isolation layer and formation of a number of second trenches arranged in the row direction in the elongated active areas and the first isolation layer. The third mask pattern 206 may be made of amorphous carbon or any other suitable material.

In this embodiment, with respect to the mask structure of the first mask patterns 210, the second mask pattern 204 and the third mask pattern 206, the second mask pattern 204 and the third mask pattern 206 are sequentially formed on the sidewalls on both sides of the first mask patterns 210 in a self-aligned way, which results in higher accuracy in position and size of the first mask patterns 210, the second mask pattern 204 and the third mask pattern 206 and improves the accuracy in position and size of the second trenches, the second groove and the fourth groove subsequently formed, thereby helping to improve the performance of memory structure and simplifying processes by eliminating the process of multiple photoetching and etching to form masks.

As shown in FIG. 7, the elongated active areas 202 (refer to FIG. 6) and the first isolation layer 203 are etched; a number of second trenches 207 arranged in the row direction are formed in the elongated active areas 202 and the first isolation layer 203; the elongated active areas 202 are disconnected by the second trenches 207 to form a number of discrete active areas 212 arranged in rows and columns; and the first trench and the second trenches 207 constitute a first groove.

In this embodiment, the third mask pattern 206, the second mask pattern 204 and the first mask patterns 210 are used as masks when etching the elongated active areas 202 and the first isolation layer 203; and an anisotropic dry etching method may be adopted as the etching process, such as anisotropic plasma etching process.

In this embodiment, as shown in FIG. 8, the elongated active area at the bottom of the second trenches 207 and the first isolation layer 203 are further etched after the second trenches 207 are formed, and a third trench 209 is formed in the elongated active area at the bottom of the second trenches 207 and the first isolation layer 203, with the size of the third trench 209 in the row direction greater than the size of the second trenches 207 in the row direction.

An isotropic etching process is used in forming the third trench 209. In one embodiment, the isotropic etching process used is wet etching.

In this embodiment, the size of the third trench 209 in the row direction being greater than the size of the second trenches 207 in the row direction. This means that the size of the third trench 209 along the y-axis direction is greater than the size of the second trenches 207 along the y-axis direction, and that when a second isolation layer is subsequently formed, the size of the bottom of the second isolation layer formed is greater, which reduces the area of the subsequently formed connection area between the source and the bottom semiconductor substrate and reduces the area of leakage path of the current in the source to the semiconductor substrate and therefore reduces leakage current. It should be noted that the size of the third trench 209 and the second trenches 207 refers to a maximum size of the third trench 209 and the second trenches 207 in the y-axis direction.

It should be noted that in other embodiments, the third trench may not be formed, and the second isolation layer may be directly formed in the second trenches subsequently.

The depth of the second trenches 207 or the total depth of the second trenches 207 and the third trench 209 is greater than the total depth of the second groove and the third groove formed subsequently. When a second isolation layer is subsequently formed in the second trenches 207 or in the second trenches 207 and the third trench 209, the second isolation layer can well isolate adjacent active areas and word lines (gate structure).

As shown in FIG. 9 to FIG. 12, a second isolation layer or a shallow trench isolation layer 211 is formed in the third trench and the second trench.

The second isolation layer or the shallow trench isolation layer 211 and the isolation layer 203 are used to isolate adjacent active areas 212, and a number of discrete active areas 212 are arranged in rows and columns on the semiconductor substrate (refer to FIG. 10).

In this embodiment, the second isolation layer or the shallow trench isolation layer 211 formed may be flush with the top surface of the first mask patterns 210, and the second isolation layer or the shallow trench isolation layer 211 may be made of silicon oxide.

After the second isolation layer or the shallow trench isolation layer 211 is formed, the second isolation layer or the shallow trench isolation layer 211 and the first isolation layer 203 constitute an insulating layer.

Figure 13:
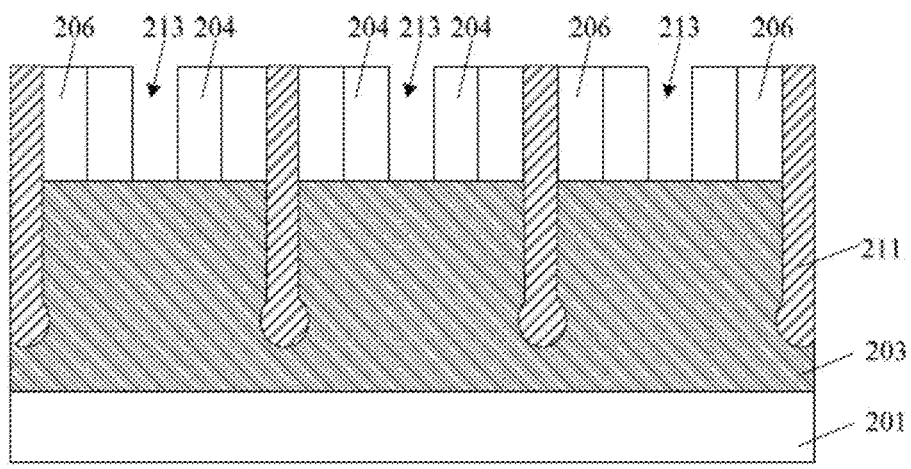

As shown in FIG. 13 which is based on FIG. 12, the first mask patterns 210 are removed (refer to FIG. 12) and a number of openings (first openings) 213 along the row direction are formed, with each opening exposing at least part of the surface of the insulating layer (the first isolation layer 203) on both sides of the active areas 212. The first mask patterns 210 may be removed by wet etching. Since the first mask patterns 210 and the second mask pattern 204 are, and the third mask pattern 206 and the second isolation layer 211 are made of different materials, there are multiple flexible etching options. Therefore, when the first mask patterns 210 are removed, the etching rate of the first mask patterns 210 is greater than that of the second mask pattern 204, the third mask pattern 206 and the second isolation layer 211, as a result of which the second mask pattern 204, the third mask pattern 206 and the second isolation layer 211 are less etched or the amount of etching is basically negligible, and the second mask pattern 204, the third mask pattern 206 and the second isolation layer 211 are reserved as masks for etching the insulating layer (the first isolation layer 203) and forming a fourth groove in the insulating layer (the first isolation layer 203).

Figure 14:
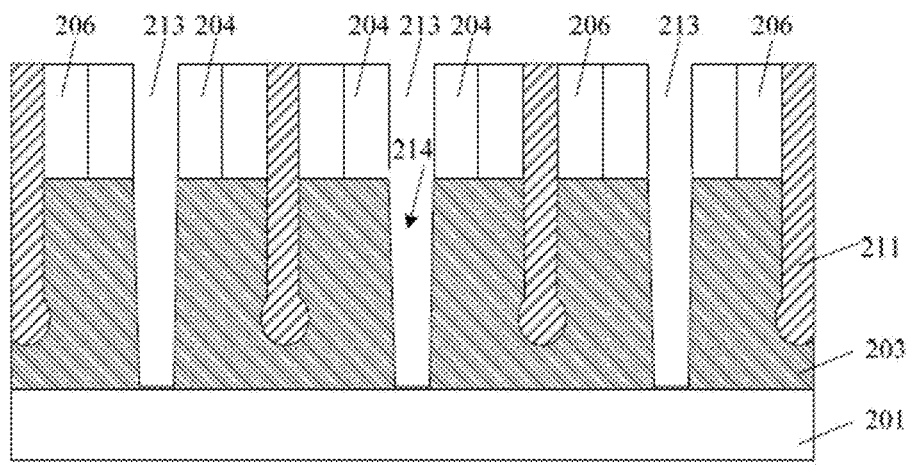

As shown in FIG. 14, the insulating layer (the first isolation layer 203) is etched along the openings 213 and the fourth groove 214 is formed in the insulating layer (the first isolation layer 203) by using the mask layers (the second mask pattern 204, the third mask pattern 206 and the second isolation layer 211) as masks, with the fourth groove 214 formed exposing part of the sidewall of active areas.

The depth of the fourth groove 214 is greater than that of the second isolation layer 211.

Figure 15:
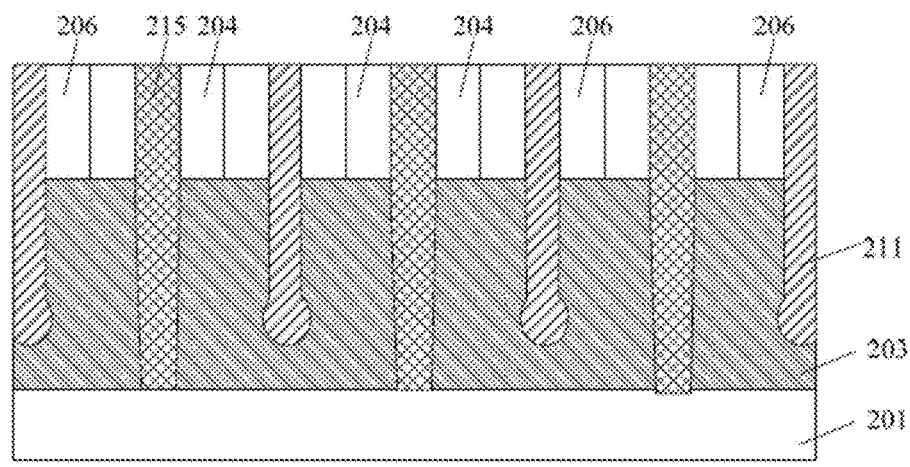

As shown in FIG. 15, an anti-etching dielectric layer 215 filling the fourth groove is formed.

The anti-etching dielectric layer 215 formed is on the sidewalls of the active areas 212 between the two second grooves formed subsequently and in the insulating layer 203 (refer to FIG. 16). The anti-etching dielectric layer 215 is made of the material different from that of the insulating layer, and is made of silicon nitride, silicon oxynitride or any other suitable material. The anti-etching dielectric layer 215 in this embodiment is made of silicon nitride, and prevents connection between adjacent second grooves or adjacent third grooves so as to form two independent word lines (gate structure) later when part of the insulating layer on both sides of the bottom of the second groove is subsequently etched and removed and when a third groove exposing at least part of the surface of the sidewalls on both sides of the active area at the bottom of the second groove is formed in in the insulating layer.

The depth of the anti-etching dielectric layer 215 is greater than the total depth of the third groove and the second groove formed subsequently, and the width of the anti-etching dielectric layer 215 in the column direction is greater than the width of the third groove in the column direction, so as to better prevent connection between adjacent second grooves or adjacent third grooves and reduce the difficulties in the process of forming the third groove when the third groove is subsequently formed.

In one embodiment, the formation process of the anti-etching dielectric layer 215 involves: forming an anti-etching dielectric material layer in the openings and the fourth groove and on the surface of the second mask pattern 204, the third mask pattern 206 and the second isolation layer 211, with the anti-etching dielectric material layer formed filling the openings and the fourth groove; planarizing and removing the anti-etching dielectric material layer on the top surface of the second mask pattern 204, the third mask pattern 206 and the second isolation layer 211; and forming an anti-etching dielectric layer 215 in the openings and the fourth groove.

Figure 16:
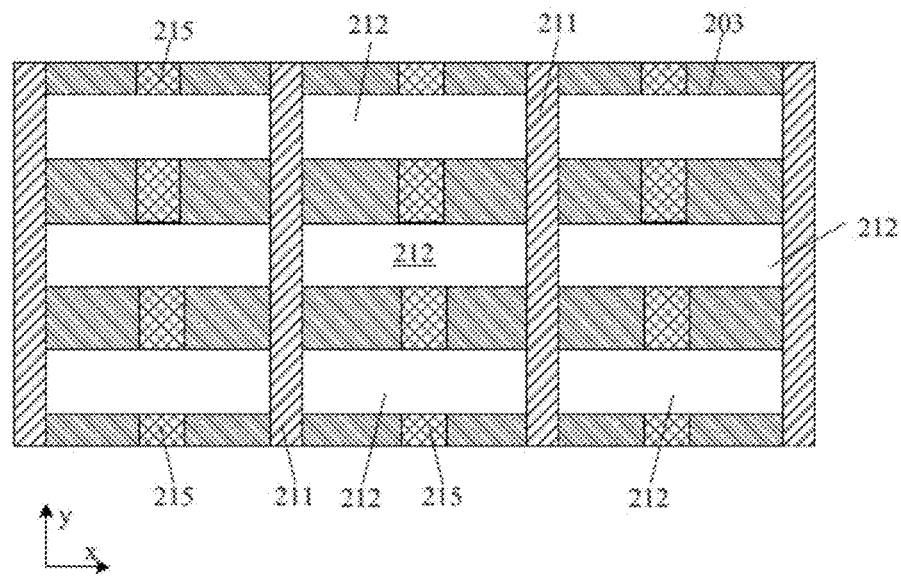
Figure 17:
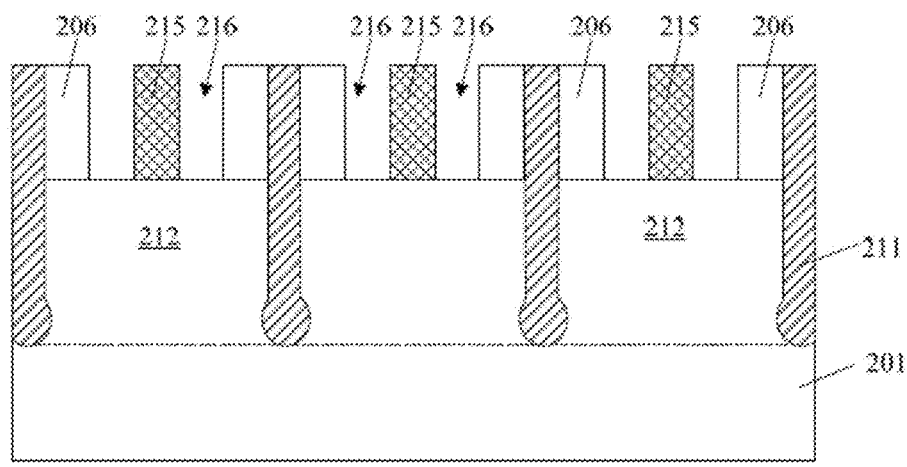
Figure 18:
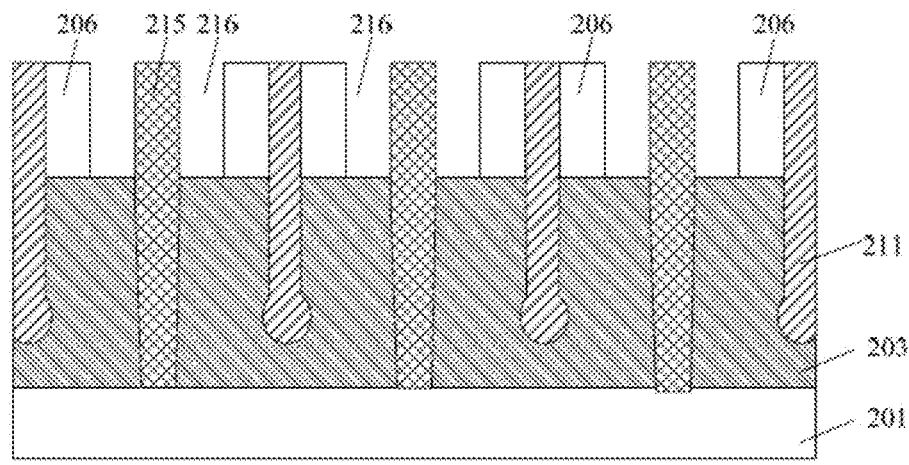

As shown in FIG. 17 which is based on FIG. 11 and FIG. 16 as well as FIG. 18 which is based on FIG. 15, the second mask pattern 204 (refer to FIG. 15) is removed, and a number of openings (second openings) 216 arranged along the row direction are formed with each opening 216 exposing at least part of the surface of the active areas 212.

There are two openings 216 on each active area 212. When the active areas 212 are subsequently etched along the two openings 216, two second grooves along the row direction can be formed in each active area 212, with the two second grooves formed dividing each active area 212 into a drain located in the middle and two sources located on both sides of the drain.

A wet etching process may be used to remove the second mask pattern 204.

In this embodiment, as shown in FIG. 18, each opening 216 exposes the surface of the insulating layer 203 at the bottom and the sidewall surface of the anti-etching dielectric layer 215.

Figure 19:
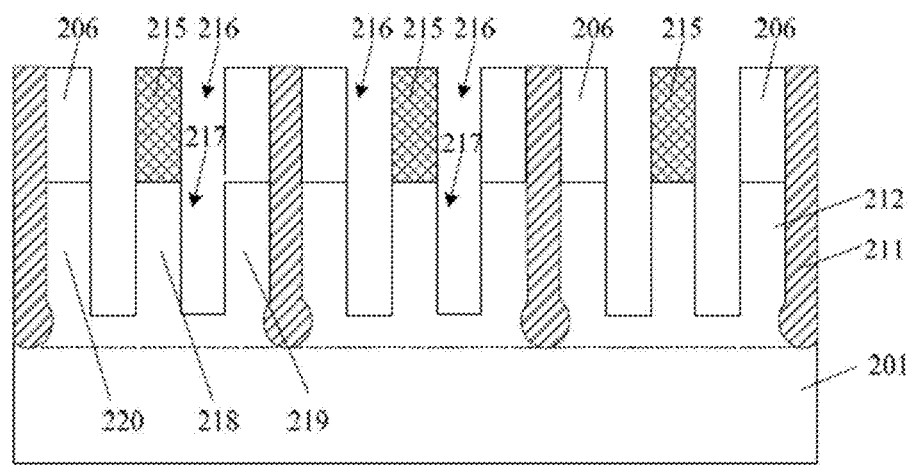
Figure 20:
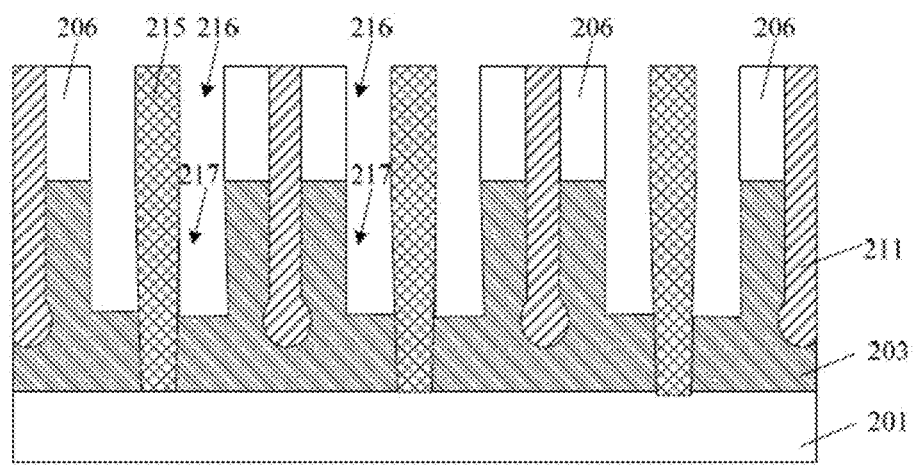

As shown in FIG. 19 which is based on FIG. 17 as well as FIG. 20 which is based on FIG. 18, the active areas 212 are etched along the openings 216; two second grooves 217 distributed along the row direction are formed in each active area 212; and the two second grooves 217 divide each active area 212 into a drain 218 located in the middle and two sources 220 and 219 located on both sides of the drain 218.

In one embodiment, the active areas 212 are etched using the plasma etching process which uses HBr or/and $Cl_2$.

In this embodiment, the two second grooves 217 formed are discrete, and divide each active area 212 into a drain 218 located in the middle and two sources 220 and 219 located on both sides of the drain 218, enabling to subsequently form two common-drain trench-type transistors after word lines (gate structure) are formed.

In other embodiments, after the two second grooves 217 are formed, the two second grooves 217 formed divide each active area 212 into a source located in the middle and two drains located on both sides of the source, enabling to subsequently form two common-source trench-type transistors after word lines (gate structure) are formed.

The depth of the second grooves 217 is smaller than that of the second isolation layer 211.

In this embodiment, when the two second grooves 217 distributed along the row direction formed in each active area 212 are etched, part of the insulating layer (the first isolation layer) 203 (refer to FIG. 20) can be etched and removed at the same time, so that the second grooves 217 formed can extend into the insulating layer (the first isolation layer) 203 on both sides of the active areas 212 and as a result of which the depth of the second grooves 217 formed on the insulating layer (the first isolation layer) 203 is equal to or less than that of the second grooves 217 formed in the active areas 212.

In other embodiments, when the two second grooves 217 distributed along the row direction formed in each active area 212 are etched, there are higher requirements in terms of etching on the material of the active areas 212 than that of the insulating layer (the first isolation layer) 203. When the second grooves 217 are formed, the insulating layer at the bottom of the openings 216 will not be or will be little etched, so that the second grooves 217 formed are only in the active areas 212.

In other embodiments, after the two second grooves 217 are formed, the two second grooves 217 formed divide each active area 212 into a source located in the middle and two drains located on both sides of the source, with one of the two drains subsequently connected to the capacitor of DRAM and the source connected to the bit line.

Figure 21:
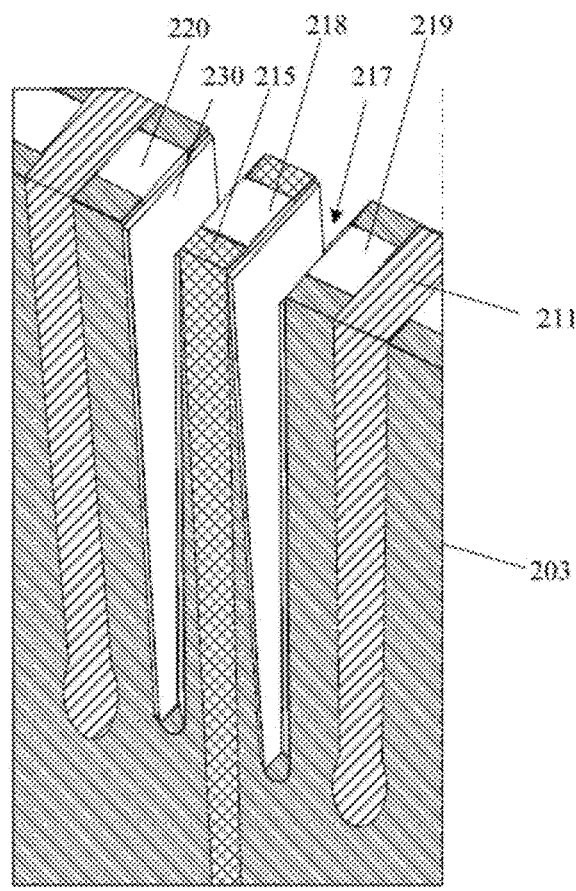

According to FIG. 21 which is a three-dimensional schematic diagram of an active area and in which the anti-etching dielectric layer and the third mask pattern on the top surface of the active area (the sources 220/219 and the drain 218) are not shown, a protective sidewall 230 is formed on the sidewall of the second grooves 217 before etching and removing part of the insulating layer on both sides of the bottom of the second grooves 217 and forming a third groove in the insulating layer 203 which exposes part of the sidewall of the active area at the bottom of the second grooves 217.

When part of the insulating layer 203 on both sides of the bottom is subsequently etched and removed, the protective sidewall 230 protects the sources 220/219 and the drain 218 on both sides of the sidewall of the second grooves 217 from damage in etching and prevents the feature size of the window of the second grooves 217 from changes.

The protective sidewall 230 and the insulating layer 203 can be made from different materials, so that the protective sidewall 230 is little etched when the insulating layer at the bottom of the second grooves 217 is etched. In one embodiment, the protective sidewall 230 is made of silicon nitride or/and silicon oxynitride, or may also be made of any other suitable material.

In one embodiment, the formation process of the protective sidewall 230 includes: forming a protective sidewall material layer on the sidewall and bottom surface of the second grooves 217; etching and removing the protective sidewall material layer on the bottom of the second grooves 217 without mask; and forming a protective sidewall 230 on the sidewall surface of the second grooves 217.

Figure 22:
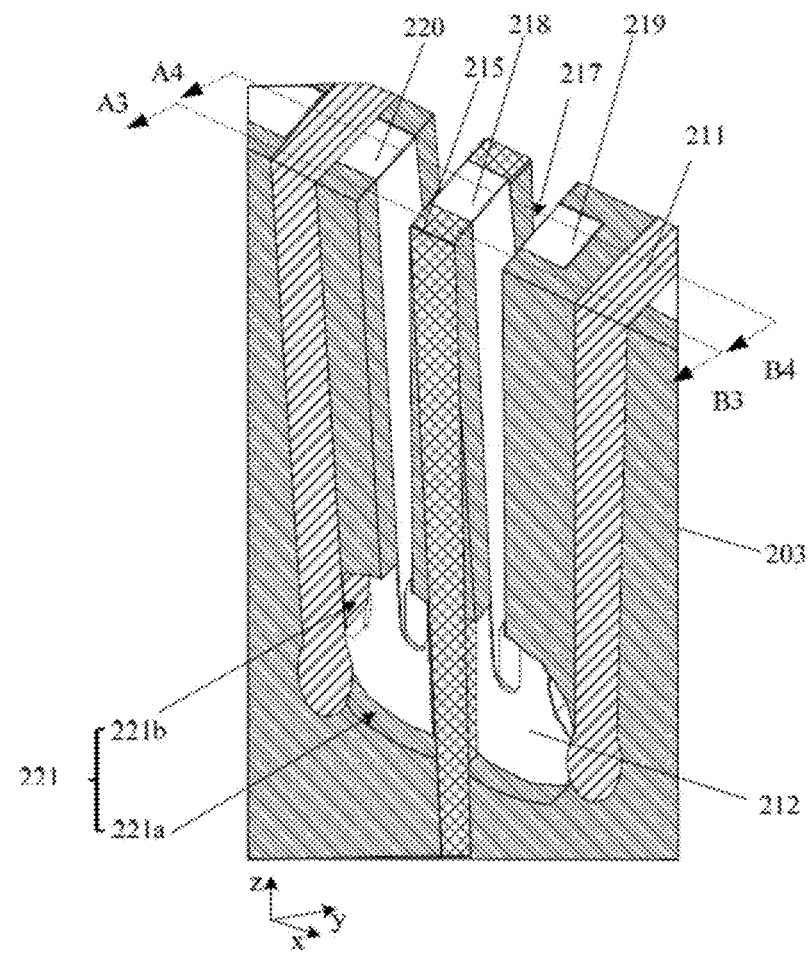
Figure 23:
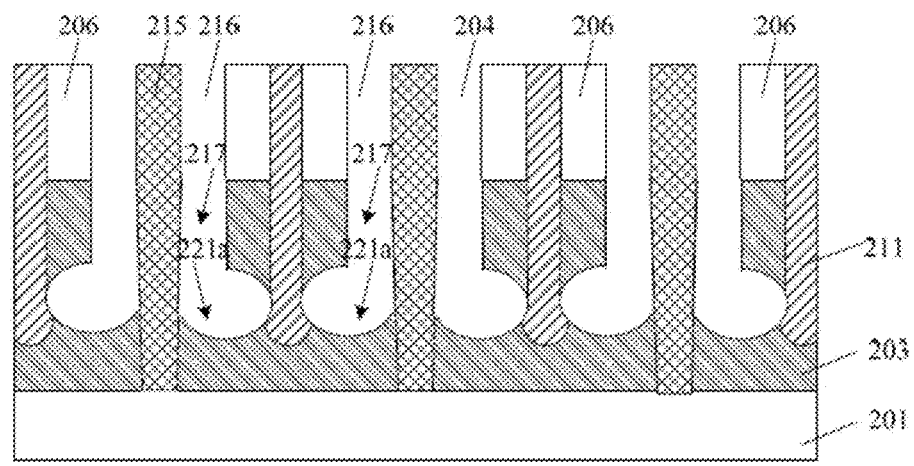
Figure 24:
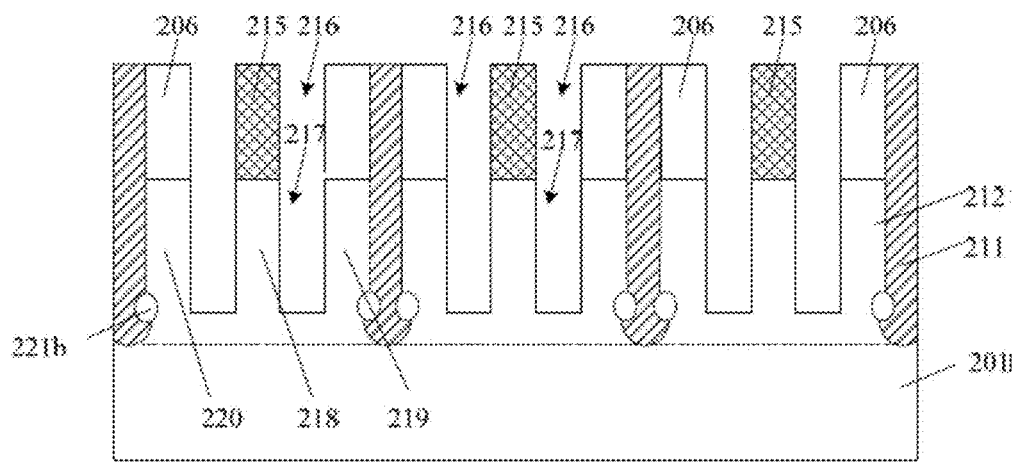

As shown in FIG. 22 to FIG. 24 among which FIG. 22 is based on FIG. 21, FIG. 23 is a cross-sectional schematic view taken in the direction of the cutting line A3B3 in FIG. 22 and FIG. 24 is a cross-sectional schematic view taken in the direction of the cutting line A4B4 in FIG. 22, part of the part of the insulating layer 203 on both sides of the bottom of the second grooves 217, and a third groove 221 is formed in the insulating layer 203 which exposes at least part of the surface of the sidewalls on both sides of the active areas 212 at the bottom of the second grooves 217, with the third groove 221 in connection with the corresponding second grooves 217 and with the two adjacent third grooves 221 not connected in the row direction (in the x-axis direction).

An isotropic wet etching process may be used to etch and remove part of the insulating layer 203 on both sides of the bottom of the second grooves 217. During etching, the anti-etching dielectric layer 215 can prevent two adjacent second grooves 217 and two adjacent third grooves 221 from being connected.

In this embodiment, in addition to exposing part of the surface of the sidewalls on both sides of the active areas 212 at the bottom of the second grooves 217, the third groove 221 also exposes part of the sidewall surface of the second trench or the third trench (the position corresponding to the second isolation layer), or part of the surface of one sidewall of the active areas 212 away from the second grooves 217. Specifically, each active area has four sidewalls, including two opposite sidewalls in the x-axis direction (row direction) and two opposite sidewalls in the y-axis direction (column direction), and the third grooves 221 include a first portion 221a and a second portion 221b that are connected to each other. The first portion 221a is located in the insulating layer 203 on both sides of the bottom of the second grooves 217, and exposes part of the surface of the sidewalls (two opposite sidewalls in the y-axis direction (column direction)) in the active areas 212 at the bottom of the second grooves 217; and the second portion 221b is located between the active areas 212 and the second isolation layer 211, and exposes part of the surface of one sidewall (a sidewall in the x-axis direction (row direction)) of the active areas 212 away from the second grooves 217. The second portion 221b is in connection with the first portion 221a. After a gate structure is subsequently formed in the third grooves 221 and the second grooves 217, the structure of the third grooves 221 enables the gate structure formed to surround the peripheral sidewalls of the active areas 212 (channel areas) between the source 220 and the drain 218, which enlarges the area of the gate structure, improves the control of the gate structure on the channel areas and further limits leakage path of the leakage current between plate of the capacitor (the capacitor is used to store data and has one of its plates electrically connected to the source) and the semiconductor substrate, thereby effectively reducing the leakage current, increasing the area of word line (there is word line in the gate structure) and lowering the resistance value of word line.

In other embodiments, the third grooves may only expose part of the surface of the sidewalls (two opposite sidewalls in the y-axis direction (column direction)) on both sides of the active areas 212 at the bottom of the second grooves 217. When a gate structure is subsequently formed in the third grooves and the second grooves 217, such a third groove structure enables the gate structure to at least cover three sides of the active areas 212 (channel areas) between the source 220 and the drain 218, which increases the area of the gate structure, improves the control of the gate structure over the channel area and limits the leakage path of the leakage current between plate of the capacitor (the capacitor is used to store data and has one of its plates electrically connected to the source) and the semiconductor substrate, thereby effectively reducing the leakage current, increasing the area of word line (there is word line in the gate structure) and lowering the resistance value of word line.

Figure 25:
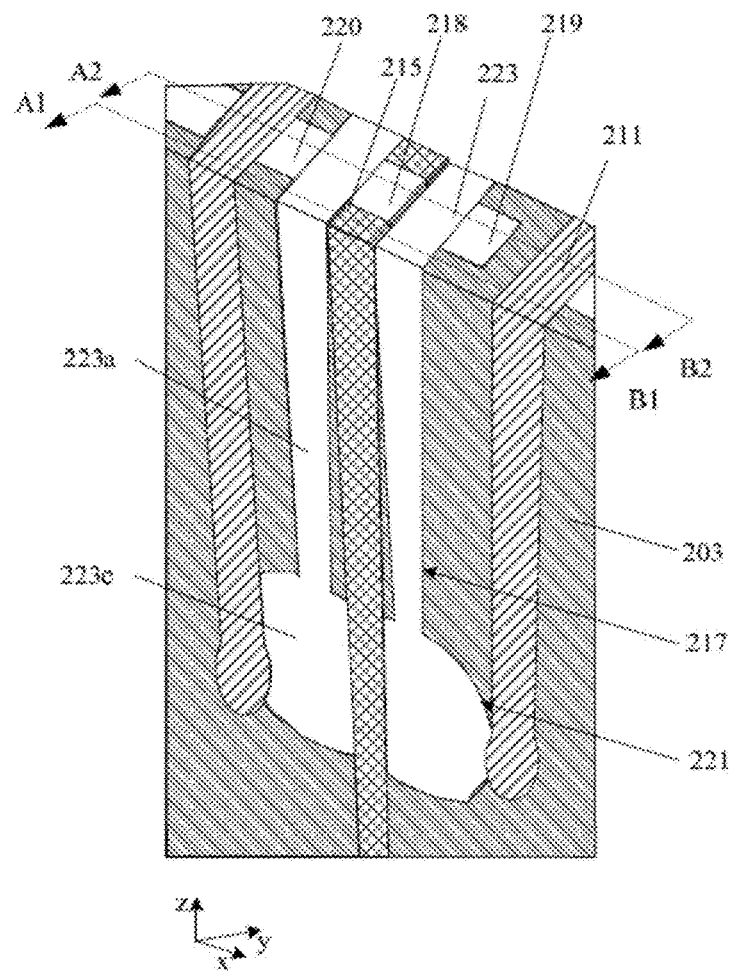
Figure 26:
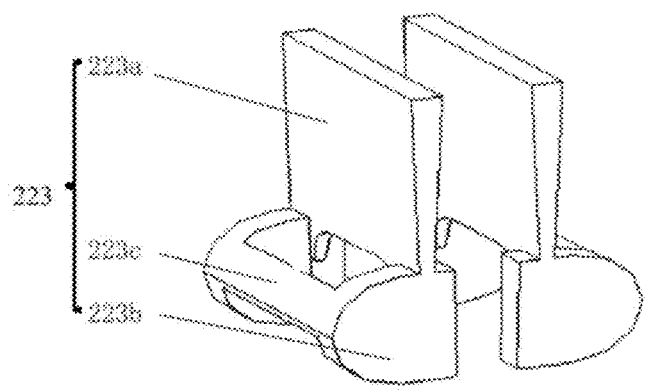
Figure 27:
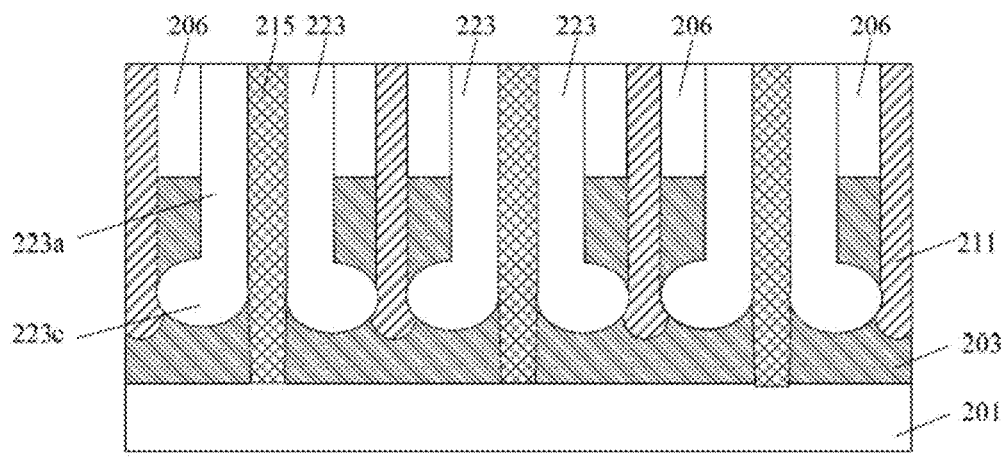
Figure 28:
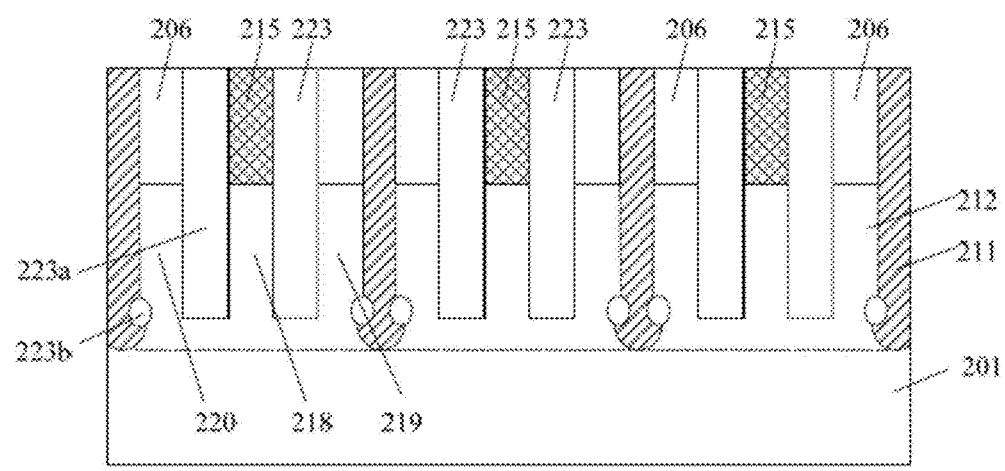

As shown in FIG. 25 to FIG. 28 among which FIG. 25 is based on FIG. 22, FIG. 26 is a three-dimensional schematic diagram of the gate structure, FIG. 27 is a cross-sectional schematic view of FIG. 25 taken along the cutting line A1B1 and FIG. 28 is a cross-sectional schematic view of FIG. 25 taken along the cutting line A2B2, a gate structure 223 is formed in the second grooves and the third grooves.

In one embodiment, the gate structure 223 is composed of a gate dielectric layer on the surface of the sidewalls of the second grooves and the third grooves, and a gate on the gate dielectric layer and filling the second grooves and the third grooves.

In one embodiment, the gate dielectric layer is made of a high-K dielectric material, such as $HfO_2$, $TiO_2$, HfZrO, HfSiNO, $Ta_2O_5$, $ZrO_2$, $ZrSiO_2$, $Al_2O_3$, $SrTiO_3$ or BaSrTiO. The word line is made of one or more metal materials such as W, Al, Cu, Ti, Ag, Au, Pt and Ni.

In other embodiments, the gate dielectric layer may be made of silicon oxide, and the word line may be made of polysilicon.

In one embodiment, the formation process of the gate structure involves: forming a gate dielectric material layer on the surface of the sidewall and bottom of the third grooves and the second grooves; forming a gate material layer on the gate dielectric material layer; removing the gate dielectric material layer and the gate material layer higher than the top surface of the sources 220/219 and the drain 218, and forming a gate structure in the third grooves and the second grooves, with the gate structure formed having a gate dielectric layer on the surface of the sidewalls of the second grooves and the third grooves; and forming a gate located on the gate dielectric layer and filling the second grooves and the third grooves. In one embodiment, the chemical mechanical polishing process or the etch-back process may be used to remove the gate dielectric material layer and the gate material layer higher than the top surface of the sources 220/219 and the drain 218, and the third mask pattern 206 (refer to FIG. 19), the anti-etching dielectric layer 215 and the second isolation layer 211 higher than the top surface of the sources 220/219 and the drain 218 can be removed at the same time when the gate dielectric material layer and the gate material layer higher than the top surface of the sources 220/219 and the drain 218 are removed.

As shown in FIG. 26, the gate structure 223 formed is composed of a first portion 223a, a second portion 223b and a third portion 223c that are connected with each other, with the first portion 223a filled in the second grooves 217 (refer to FIG. 22), the second portion 223b filled in the first portion 221a of the third grooves 221 (refer to FIG. 22) and the third portion 223c filled in the second portion 221b of the third grooves 221 (refer to FIG. 22).

In one embodiment, after the gate structure 223 is formed, the formation method of memory structure also involves: forming a word line connected to the gate; forming a capacitor connected to the source 220 (or the source 219) on the insulating layer 203 (not shown in accompanying drawings); and forming a bit line connected to the drain 218 on the insulating layer 203 (not shown in accompanying drawings).

The embodiments of the present invention also provide a memory structure which, as shown in FIG. 25 to FIG. 28, is composed of:

A semiconductor substrate 201 on which a number of discrete active areas 212 arranged in rows and columns are formed. There is a first groove between adjacent active areas, which is filled with insulating layers (the insulating layer 203 and the insulating layer 211);

Two second grooves 217 along the row direction in each active area 212. The two second grooves 217 divide each active area 212 into a drain 218 located in the middle and two sources 219/220 located on both sides of the drain;

A third groove 221 in part of the insulating layers (the insulating layer 203 and the insulating layer 211) on both sides of the bottom of the second groove 217. The third groove 221 exposes at least part of the surface of the sidewalls on both sides of the active area 212 at the bottom of the second groove 217, and is in connection with the corresponding second groove 217. The two adjacent third grooves 217 are not connected in the row direction;

A gate structure 223 in the second groove 217 and the third groove 221.

In one embodiment, an anti-etching dielectric layer 215 is formed on the sidewalls of the active area between the two second grooves 217 and in the insulating layers (the insulating layer 203 and the insulating layer 211). The anti-etching dielectric layer 215 is made of the material different from that of the insulating layer 203.

The depth of the anti-etching dielectric layer 215 is greater than the total depth of the third groove 221 and the second groove 217; and the width of the anti-etching dielectric layer 215 in the column direction is greater than the width of the third groove 221 in the column direction.

In one embodiment, a protective sidewall is formed on the sidewall of the second groove 217.

In one embodiment, the first groove includes a first trench in a column direction and a second trench in a row direction, with the first trench filled with the first isolation layer 203 and the second trench filled with the second isolation layer 211. The second isolation layer or the shallow trench isolation layer 211 and the first isolation layer 203 constitute an insulating layer.

In one embodiment, a third trench is formed at the bottom of the second trench, with the size of the third trench in the row direction greater than the size of the second trench in the row direction. The third trench and the second trench are filled with the second isolation layer or the shallow trench isolation layer.

In one embodiment, the depth of the second trench or the total depth of the second trench and the third trench is greater than the total depth of the second groove 217 and the third groove 221.

In this embodiment, in addition to exposing part of the surface of the sidewalls on both sides of the active area at the bottom of the second groove 217, the third groove 221 also exposes part of the sidewall surface of the second trench or the third trench, or part of the surface of one sidewall of the active area 212 away from the second groove.

In other embodiments, the third groove only exposes part of the surface of the sidewalls on both sides of the active area at the bottom of the second groove.

In one embodiment, the gate structure 223 includes: a gate dielectric layer located on the sidewall surfaces of the second groove and the third groove; and a gate located on the gate dielectric layer and filled with the second groove and the third groove.

As shown in FIG. 26, the gate structure 223 formed is composed of a first portion 223a, a second portion 223b and a third portion 223c that are connected with each other, with the first portion 223a filled in the second grooves 217 (refer to FIG. 22), the second portion 223b filled in the first portion 221a of the third grooves 221 (refer to FIG. 22) and the third portion 223c filled in the second portion 221b of the third grooves 221 (refer to FIG. 22).

The gate structure 223 formed is further composed of: a word line connected to the gate; a capacitor connected to the source 219 (or the source 220) on the insulating layer 203 (not shown in accompanying drawings), and a bit line connected to the drain 218 on the insulating layer 203 (not shown in accompanying drawings).

It should be noted that other definitions or descriptions related to the memory structure in this embodiment will not be further explained. For details, please refer to the corresponding definitions or descriptions in the foregoing embodiments concerning formation process of memory structure.

Although the present invention has been disclosed as above in various embodiments, the present invention should not be limited by those embodiments. Those skilled in the art may make changes or modifications to the present invention based on the methods and technical solutions disclosed above without departing from the spirit and scope of the present invention. Therefore, any simple alterations, equivalent changes and modifications made to the foregoing embodiments based on the technical essence of the present invention without departing from the technical solutions proposed in the present invention are deemed to fall within the protection scope of the technical solutions in the present invention.

What is claimed is:

1. A method for forming a memory structure, the method comprising:
   providing a semiconductor substrate, wherein discrete active areas are arranged in rows and columns on the semiconductor substrate, and a first groove exists between two of the discrete active areas that are adjacent, the first groove being filled with an insulating layer;
   etching the discrete active areas and forming two second grooves along a row direction in each of the discrete active areas, wherein the two second grooves divide each of the discrete active areas into a drain located in middle of each of the discrete active areas and two sources located on both sides of the drain;
   etching to remove part of the insulating layer on both sides of a bottom of each of the second grooves, and forming a third groove in the insulating layer to expose at least part of a surface of sidewalls on both sides of each of the discrete active areas at the bottom of each of the second grooves, wherein the third groove is in connection with each of the second grooves and the third groove is not connected in the row direction with another third groove; and
forming a gate structure in the second groove and the third groove.

2. The method according to claim 1, wherein an anti-etching dielectric layer is formed on top surface of each of the discrete active areas between the two second grooves and in the insulating layer; and wherein the anti-etching dielectric layer is made of a material different from that of the insulating layer.

3. The method according to claim 2, wherein a depth of the anti-etching dielectric layer is greater than a total depth of the third groove and the second groove, and a width of the anti-etching dielectric layer in the column direction is greater than a width of the third groove in the column direction.

4. The method according to claim 2, wherein forming the anti-etching dielectric layer comprises:
   forming a mask layer on the insulating layer and the discrete active areas, wherein the mask layer comprises a number of openings along the row direction, wherein each opening exposing at least part of the surface of the insulating layer on both sides of each of the active areas; and
   etching the insulating layer along the openings by using the mask layer as a mask and forming a fourth groove in the insulating layer, wherein the fourth groove exposes part of the sidewall of each of the discrete active areas; and forming an anti-etching dielectric layer filling the fourth groove.

5. The method according to claim 1, wherein a protective sidewall is formed on the sidewall of each of the second grooves before the part of the insulating layer on both sides of the bottom of each of the second grooves is etch removed and before the third groove is formed in the insulating layer exposing part of the sidewall of each of the discrete active areas at the bottom of the second groove.

6. The method according to claim 1, wherein forming the discrete active areas arranged in rows and columns on the semiconductor substrate comprises:
   forming a number of discrete elongated active areas arranged in a column direction on the semiconductor substrate, forming a first trench between adjacent discrete elongated active areas and filling the first trench with a first isolation layer; and
   etching the elongated active areas and the first isolation layer, and forming a number of second trenches arranged in a row direction in the elongated active areas and the first isolation layer, wherein the second trench cutting off the elongated active areas to form a number of discrete active areas arranged in rows and columns and with a first groove formed by the first trench and the second trench.

7. The method according to claim 6, wherein a second isolation layer filling the second trench is formed, wherein an insulating layer is formed by the first isolation layer and the second isolation layer.

8. The method according to claim 7, wherein
   the elongated active area at a bottom of the second trench and the first isolation layer are etched and a third trench is formed in the elongated active area at the bottom of the second trench and in the first isolation layer before forming the second isolation layer, wherein the size of the third trench in the row direction larger than the size of the second trench in the row direction;
   a second isolation layer is formed in the third trench and the second trench.

9. The method according to claim 7, wherein a depth of the second trench or a total depth of the second trench and a third trench is greater than the total depth of the second groove and the third groove.

10. The method according to claim 7, wherein the third groove further exposes part of the sidewall surface of the second trench or the third trench, or part of the surface of one sidewall of each of the discrete active areas away from each of the second grooves.

11. The method according to claim 1, wherein the third groove only exposes part of the surface of the sidewalls on both sides of each of the discrete active areas at the bottom of each of the second grooves.

12. A memory structure, comprising:
a semiconductor substrate, wherein discrete active areas are arranged in rows and columns on the semiconductor substrate, and a first groove exists between two of the discrete active areas that are adjacent, the first groove being filled with an insulating layer;
two second grooves along a row direction in each of the active areas, wherein the two second grooves divide each of the discrete active areas into a drain located in middle of each of the discrete active areas and two sources located on both sides of the drain;
a third groove formed in part of the insulating layer and on both sides of a bottom of each of the second grooves, wherein the third groove exposes at least part of a surface of sidewalls on both sides of each of the discrete active areas at the bottom of each of the second grooves, and is in connection with each of the second grooves, wherein the third groove is not connected in the row direction with another third groove adjacent to the third groove; and
a gate structure in the second groove and the third groove.

13. The memory structure of claim 12, wherein an anti-etching dielectric layer is formed on top surface of each of the discrete active areas between the two second grooves and in the insulating layer, wherein the anti-etching dielectric layer is made of a material different from that of the insulating layer.

14. The memory structure according to claim 13, wherein a depth of the anti-etching dielectric layer is greater than a total depth of the third groove and the second groove; and a width of the anti-etching dielectric layer in the column direction is greater than the width of the third groove in the column direction.

15. The memory structure according to claim 12, wherein a protective sidewall is formed on the sidewall of each of the second grooves.

16. The memory structure according to claim 12, wherein the first groove includes a first trench in a column direction and a second trench in a row direction, wherein the first trench is filled with a first isolation layer, and the second trench is filled with a second isolation layer.

17. The memory structure according to claim 16, wherein a third trench is formed at a bottom of the second trench, wherein a size of the third trench in the row direction greater than the size of the second trench in the row direction, wherein the third trench and the second trench are filled with the second isolation layer.

18. The memory structure according to claim 17, wherein a depth of the second trench or a total depth of the second trench and the third trench is greater than the total depth of the second groove and the third groove.

19. The memory structure of claim 16, wherein the third groove further exposes part of the sidewall surface of the second trench or a third trench, or part of the surface of one sidewall of each of the discrete active areas away from each of the second grooves.

20. The memory structure of claim 12, wherein the third groove only exposes part of the surface of the sidewalls on both sides of each of the discrete active areas at the bottom of each of the second grooves.

* * * * *